United States Patent [19]
Grabbe

[11] Patent Number: 4,959,029
[45] Date of Patent: Sep. 25, 1990

[54] ELECTRICAL CONTACT

[75] Inventor: Dimitry G. Grabbe, Middletown, Pa.

[73] Assignee: AMP Incorporated, Harrisburg, Pa.

[21] Appl. No.: 395,621

[22] Filed: Aug. 18, 1989

[51] Int. Cl.⁵ .............................................. H01R 4/48
[52] U.S. Cl. ........................................ 439/862; 439/71
[58] Field of Search ............................. 439/55, 71–73, 439/525, 325–328, 629–637, 861, 862

[56] References Cited

U.S. PATENT DOCUMENTS

| | | | |
|---|---|---|---|
| 4,513,353 | 4/1985 | Bakermans et al. | 439/71 |
| 4,645,279 | 2/1987 | Grabbe et al. | 439/68 |
| 4,684,184 | 8/1987 | Grabbe et al. | 439/68 |
| 4,737,120 | 4/1988 | Grabbe et al. | 439/328 |

FOREIGN PATENT DOCUMENTS 0052973  6/1982  European Pat. Off. ............ 439/326

Primary Examiner—David L. Pirlot

[57] ABSTRACT

An electrical contact (110) formed as a monolithic element having three beam portions (114, 116, 124) and inherent springiness. The contact (110) is so configured that a relatively large deflection at a contact point (130) is transformed into a small deflection at the point (108) where the spring action is effective so that a relatively flat force/deflection characteristic is attained. A kinematic model and three embodiments of the contact are disclosed, as well as a method of formation thereof.

11 Claims, 5 Drawing Sheets

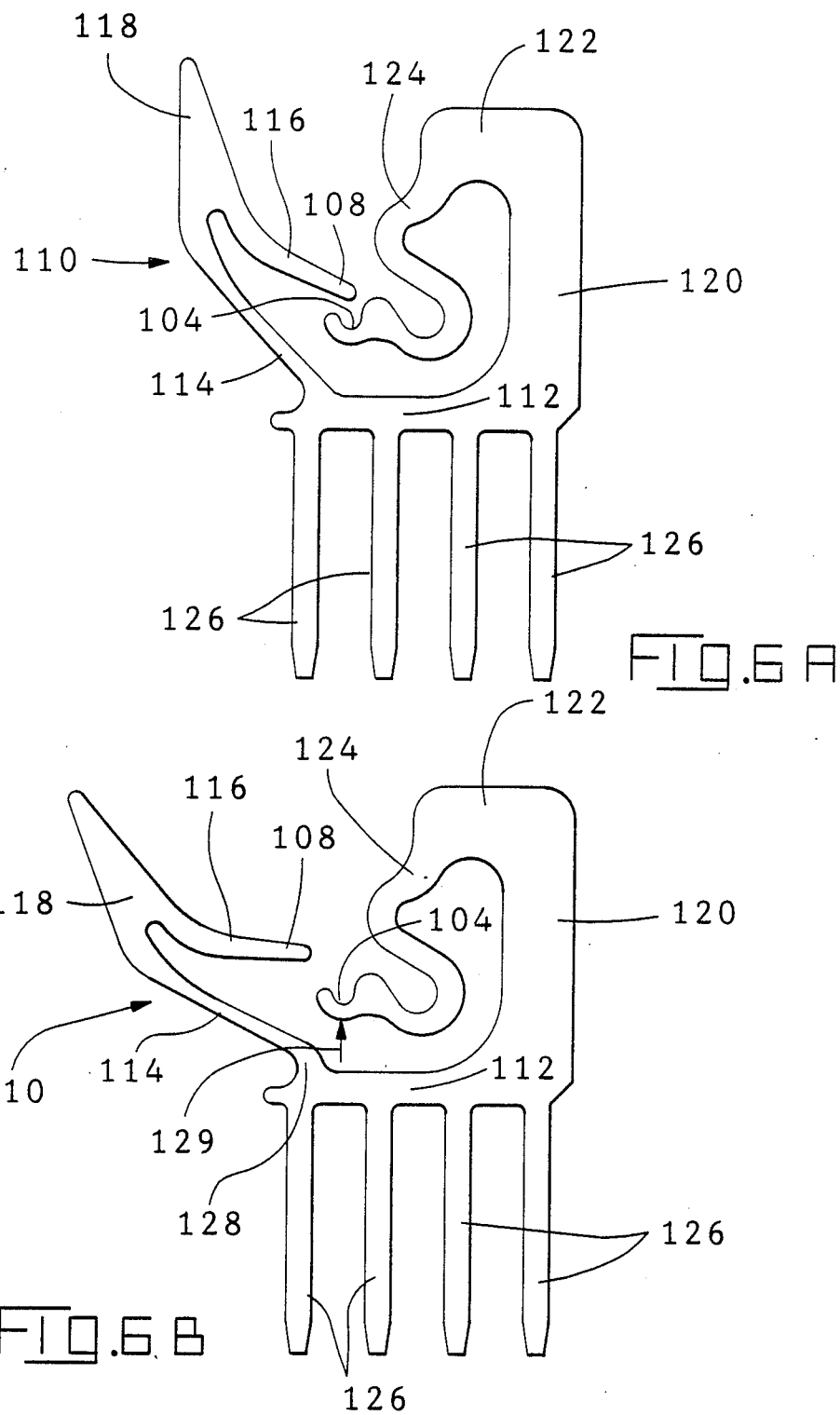

ELECTRICAL CONTACT

BACKGROUND OF THE INVENTION

This invention relates to connector assemblies for integrated circuit chips and, more particularly, to an improved electrical contact for use therein.

When designing connector assemblies for use with integrated circuit chips, different requirements for the contact element, which provides an electrical path between the chip and a printed circuit board on which the connector assembly is mounted, must be met. One requirement is that the portion of the contact which interfaces with the chip carrier be able to sustain a relatively large deflection in order to accommodate manufacturing dimensional variations or tolerances between individual chip packages. It is not unusual, at the present time, to have a variation of as much as 0.030 inch between the minimum and maximum dimensions of component chip packages from different manufacturers. At the same time, the contact force over that range must not vary very much. Thus, a relatively flat force/deflection curve is desirable. By way of example, in the case when the electrical contact is tin plated, the contact force should be approximately 220 grams for the minimum deflection of the contact and approximately 400 grams for the maximum deflection of the contact. This imposes certain requirements on the spring which generates the contact force. However, the space in which a spring of such compliance is to be designed must be small for a number of reasons. A first reason is that the high cost of material requires economy of size. A second reason is that electrical requirements dictate a short electrical path to minimize self-inductance in the contact.

Opposing these requirements is the known physical effect that a large deflection of metal usually results in a permanent, or plastic, deformation of the metal. If, however, a straight beam, by way of example, is to be deflected the required distance and stay within its elastic limit (i.e., a deformation magnitude within which the part will totally recover to its original position after removal of the deforming force) such a beam would have to be relatively long and would not satisfy the electrical length or space requirements.

It is therefore a primary object of this invention to provide a contact of the type described wherein a relatively short beam is deflected and the relatively large deflection of that short beam, beyond the elastic limit of the beam, is changed into a small deflection at another location at which a spring is acting, thereby permitting the spring to stay within its elastic limit.

It is another object of this invention to provide such a contact as a monolithic element.

SUMMARY OF THE INVENTION

The foregoing and additional objects are attained in accordance with the principles of this invention by making an electrical contact using the steps of first forming from a planar metal sheet a monolithic planar blank having a base, a first beam extending away from the base, a second beam extending from the distal end of the first beam toward the base, a support extending away from the base, and a third beam extending from the distal end of the support toward the base, then bending, within the plane of the blank, the first beam away from the third beam beyond the elastic limit of the first beam, and finally bending, within the plane of the blank, the first beam back toward the third beam so that the free end of the second beam pivotally engages the third beam, the bending continuing until the elastic limit of the first beam is again exceeded.

These steps result in the formation of an electrical contact for providing an electrical path between a first contact portion and a second contact portion and providing a contact force at the first contact portion. The contact includes a base having the second contact portion projecting therefrom and a first beam having first and second ends and the first contact portion, the first beam first end being attached to the base. The contact further includes a second beam having first and second ends with the second beam first end being attached to the first beam second end and the second beam second end extending toward the base. The contact further includes a third beam having first and second ends, with the third beam first end arranged for pivoting movement with respect to the second beam second end, the third beam second end being attached to the base. Spring means are provided for resiliently coupling the first contact portion to the base.

In accordance with an aspect of this invention, the base, the first, second and third beams, and the spring means are substantially co-planar.

In accordance with another aspect of this invention, the contact is formed as a monolithic element from a planar metal sheet.

In accordance with a further aspect of this invention, the first beam is cantilevered from the base at its first end and the compliance of the metal forming the contact allows pivoting movement of the first beam relative the base.

BRIEF DESCRIPTION OF THE DRAWINGS

The foregoing will be more readily apparent upon reading the following description in conjunction with the drawings in which like elements in different figures thereof have the same reference numeral and wherein:

FIGS. 6A, 6B, 6C and 6D illustrate steps in the formation of the contact shown in FIG. 5.

DETAILED DESCRIPTION

Figure 1:
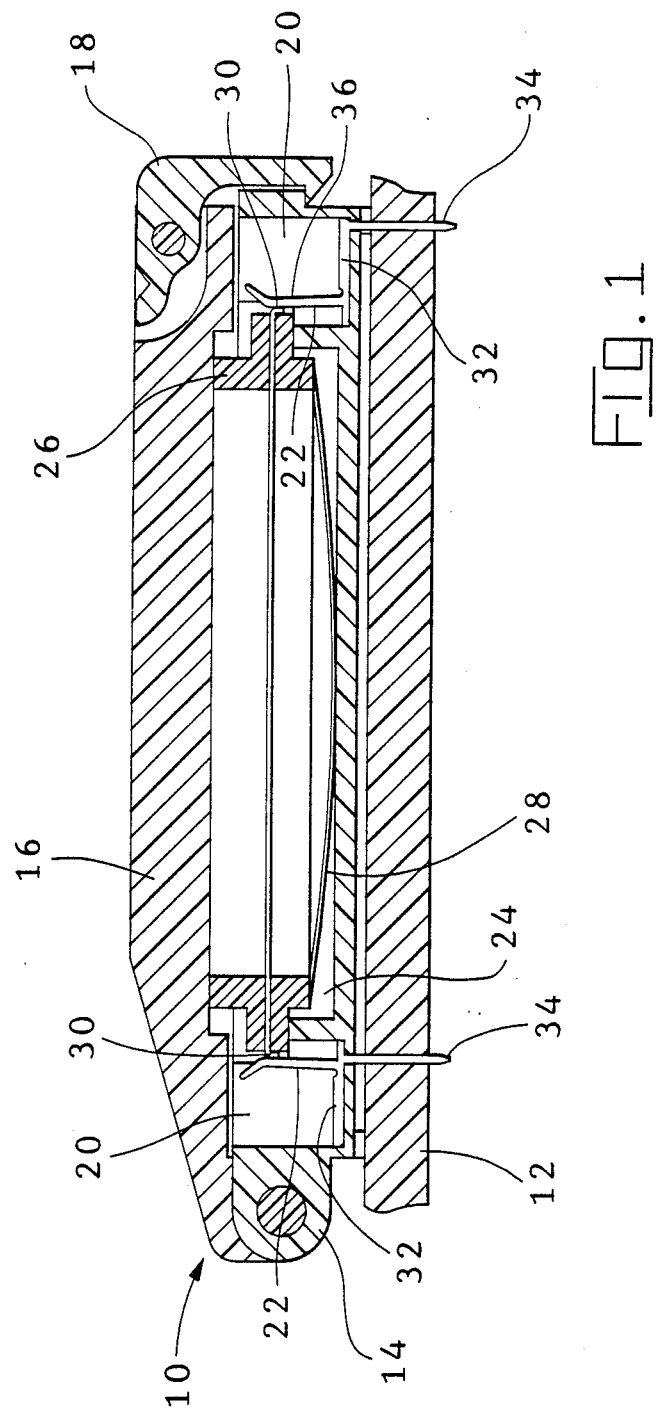
FIG. 1 is a cross-sectional view through an illustrative connector assembly in which an electrical contact constructed in accordance with the principles of this invention may be utilized.

Referring to the drawings, FIG. 1 shows a connector assembly, designated generally by the reference numeral 10, mounted on a printed circuit board 12 and in which a contact according to this invention may be utilized. The connector assembly 10 is of the type utilized for burn-in testing of an integrated circuit chip and includes, generally, a body portion 14, a hinged cover member 16, and a latch member 18 for releasably securing the cover member 16 to the body portion 14 in a closed position. The body portion 14 is formed with a plurality of cavities 20, each for holding a single electrical contact, schematically shown at 22. The cavities 20 are arranged around the periphery of a central pocket 24, sized so as to accept the integrated circuit chip package 26. Within the bottom of the pocket 24 there is disposed a spring member 28 which is utilized to spring load the package 26 so that upon opening of the cover member 16, the package 26 is partially ejected.

The package 26 is formed with leads along its periphery, illustratively depicted at 30. These leads 30 are adapted for contact with respective ones of the contacts 22 disposed in the cavities 20. As schematically shown in FIG. 1, each of the contacts 22 has a base portion 32 from which a downwardly depending contact leg 34 extends for insertion into an appropriately sized and spaced opening through the printed circuit board 12, as is conventional in the art. A contact arm 36 extends upwardly from the base portion 32 for surface contact with the package lead 30 upon insertion of the package 26 into the pocket 24. One of the requirements for the contact 22 is that the contact arm 36 exerts a contact force against the package lead 30. If all elements could be made perfectly, and there were no variations in the size of the package 26, then this contact force could be generated by the inherent resiliency of the contact arm 36 cantilevered on the base portion 32. However, in the real world, there are manufacturing tolerances for the package 26 which vary from manufacturer to manufacturer. The contact arm 36 must be capable of accommodating these tolerances, which may be on the order of 0.030 inch from the largest to the smallest size package, while still exerting an appropriate contact force. If the contact arm 36 was constructed as a simple beam as shown in FIG. 1, the large deflection from the largest size package 26 would deform the contact arm 36 beyond its elastic limits so that when a smaller package 26 was inserted in the pocket 24, the contact arm 36 could not spring back to apply the required contact force. If size were not at a premium, then the contact arm 36 could be lengthened. However, as previously described, size is limited. Thus, a contact 22 must be designed which is small in size and capable of accommodating the relatively large deflection noted above while still retaining its effective resiliency so that an appropriate contact force is generated over the entire range of package sizes.

Figure 2:
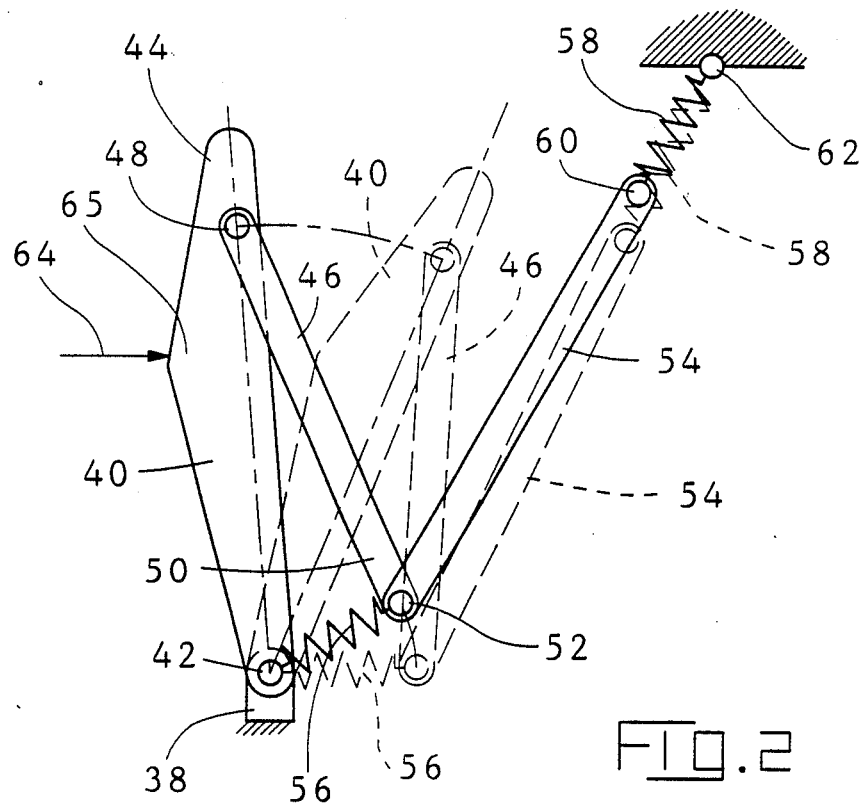
FIG. 2 is a kinematic model of a design for a contact embodying the principles of this invention.

FIG. 2 illustrates a kinematic model of a contact which transforms a large deflection of a short beam to a very small deflection at another location where a spring is acting, permitting the spring to stay within its elastic limit. The model includes a base 38 and a first beam 40 having a first end 42 and a second end 44. The first end 42 of the first beam 40 is attached to the base 38 for pivoting movement. A second beam 46 is attached at its first end 48 for pivoting movement on the first beam second end 44 and extends back toward the base 38. The second beam second end 50 has pivotally attached thereto the first end 52 of a third beam 54. A first spring 56 resiliently couples the first beam first end 42 to the second beam second end 50 and a second spring 58 resiliently couples the third beam second end 60 to a support 62 which is fixed relative to the base 38. If a force is applied to the beam 40, as indicated by the arrow 64, this force being equivalent to the force exerted on the contact arm 36 by the package lead 30 (FIG. 1), the beam 40 will be pivoted clockwise about its first end 42 to the position shown by the broken lines. This will cause the pivot point at the second beam second end 50 to also rotate about the first beam first end 42 and results in a small downward vertical displacement thereof. This displacement will be a fraction of the horizontal displacement of the first beam second end 44. Movement from the equilibrium position shown by the solid lines in FIG. 2 to the position shown by the broken lines will be resisted by the springs 56 and 58. In effect, the springs 56 and 58 resiliently couple the area 65, where the force 64 is applied, to the base 38 so as to generate the desired contact force. When the force indicated by the arrow 64 is removed, the mechanism shown in FIG. 2 will return from the displaced position shown by the broken lines to the equilibrium position shown by the solid lines.

From studying the mechanism shown in FIG. 2, it will be appreciated that the relatively large deflection of the beam 40 resulting in a small deflection of the third beam first end 52 imposes a small displacement along the third beam 54, which can then be conventionally acted upon by the spring 58, and the spring 58 may have a very steep force/deflection curve, while the composite spring rate tending to return the beam 40 to its equilibrium position will be relatively flat.

Figure 3:
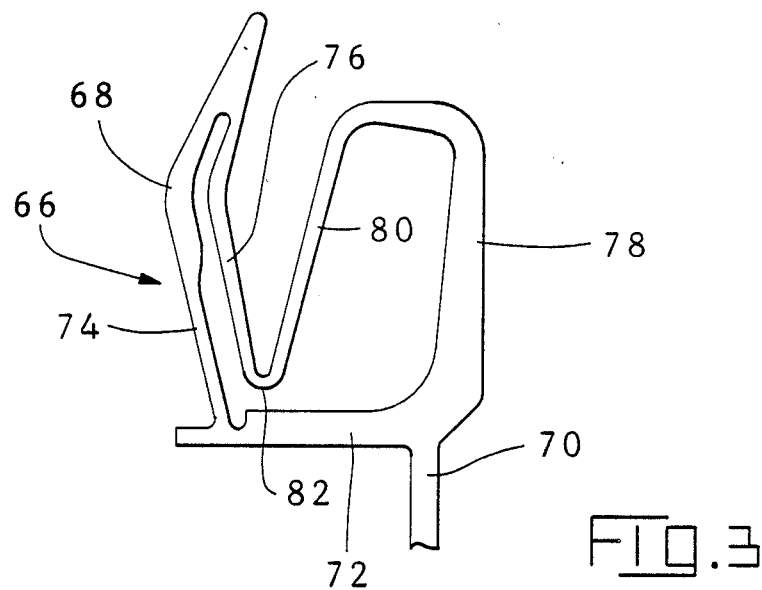
FIG. 3 shows a first illustrative form of an electrical contact constructed in accordance with the principles of this invention.

As previously described, the size of the cavity 20 is limited. In some cases, the cavity may be 0.150 inch by 0.220 inch and must accommodate a contact having a thickness of 0.010 inch. It is apparent that a mechanism of the complexity shown in FIG. 2 cannot, at this time, be constructed with any practical technology to satisfy those size constraints. However, in accordance with the principles of this invention, there can be constructed from a monolithic piece of metal a direct analog of the mechanism shown in FIG. 2. A first illustrative form of such an electrical contact, designated generally by the reference numeral 66, is depicted in FIG. 3. The contact 66 is formed as a monolithic element from a planar metal sheet. It provides an electrical path between a first contact portion 68 and a second contact portion 70 as well as a contact force at the first contact portion 68, directed toward the left as viewed in FIG. 3. The contact element 66 includes a base portion 72, from which the second contact portion 70 extends, and a first beam 74 extending from the base portion 72 in a cantilevered fashion. The first contact portion 68 is formed as part of the first beam 74. A second beam 76 extends from the distal end of the first beam 74 back toward the base portion 72. As part of the base portion 72, extending upwardly therefrom is an L-shaped support element 78, at the distal end of which is joined a third beam 80 which extends toward the base portion 72 and is joined at 82 to the second beam 76. The base portion and the first, second and third beams of the contact element 66 correspond to the base and the first, second and third beams of the kinematic model of FIG. 2. The resiliency of the parts of the contact element 66 corresponds to the springs 56 and 58 of the kinematic model. Further, all pivoting motion of the kinematic model is accommodated by the elasticity of the metal forming the contact element 66. Thus, at the juncture of the first beam 74 and the base portion 72, there can be some relative pivoting movement.

Figure 4:
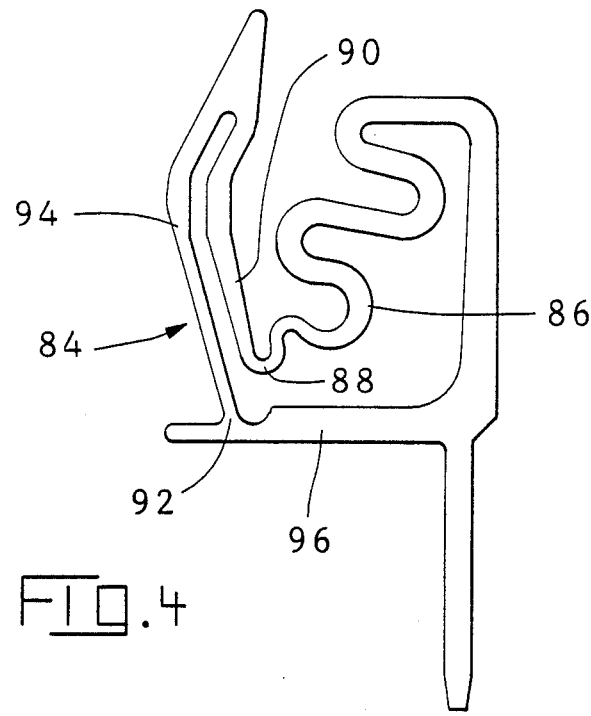
FIG. 4 shows a second illustrative form of an electrical contact constructed in accordance with the principles of this invention.

FIG. 4 depicts a second illustrative form of an electrical contact element, designated generally by the reference numeral 84, which is an analog of the kinematic model shown in FIG. 2. The primary difference between the contact elements 66 and 84 is that in the contact element 84 the third beam 86 is serpentine, rather than straight as in the contact element 66. This provides additional resiliency and allows for a more precise tailoring of the resultant contact force.

There may be situations where there is a need for improvement in the flexure range of the contact. As viewed in FIG. 4, the major plastic deformation due to overstressing occurs in the region 88 at the juncture between the third beam 86 and the second beam 90. Additionally, in the region 92 where the first beam 94 is cantilevered to the base 96, a lesser plastic deformation takes place.

Figure 5:
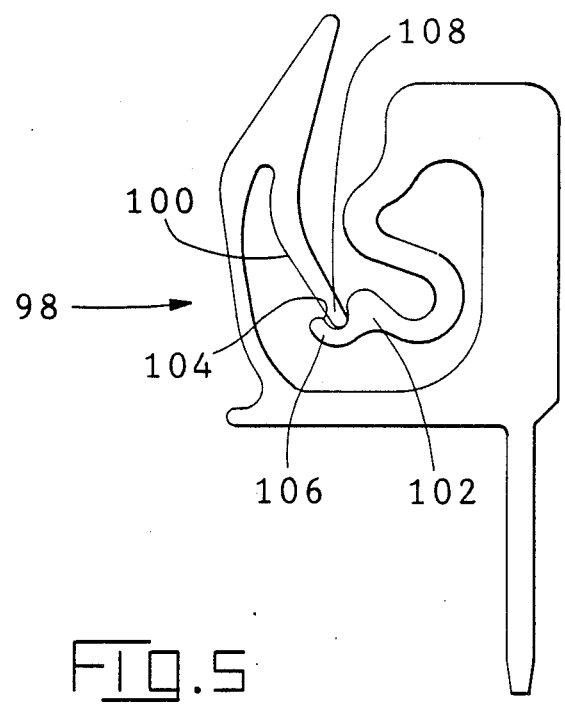
FIG. 5 shows a preferred form of an electrical contact constructed in accordance with the principles of this invention.

In accordance with the principles of this invention, the plastic deformation in the region 92 is beneficially exploited in the preferred embodiment of the contact element, designated generally by the reference numeral 98, shown in FIG. 5. As shown therein, the second beam 100 and the third beam 102 are separated. The serpentine shape of the beam 102 is such that a pocket 104 is formed by an undulation at the end 106, and the free end 108 of the second beam 100 lies within the pocket 104. This arrangement accommodates pivoting movement between the beams 100 and 102. If the contact element 98 were to be stamped from a planar metal sheet in the form shown in FIG. 5, this would not prove to be entirely satisfactory because the deflection range which could be accommodated thereby would be too limited. As will become apparent from the following discussion, some preworking of the contact element 98 results in fully satisfying all requirements.

Figure 6C:
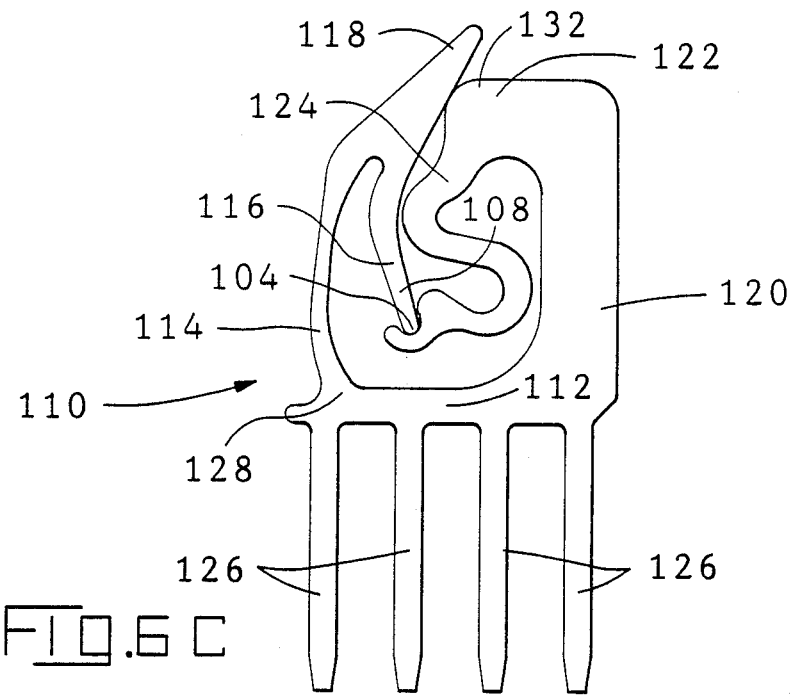

FIGS. 6A, 6B, 6C and 6D illustrate steps in forming the final configuration of the contact element 98 shown in FIG. 5. The first step in the construction process is to form a monolithic planar blank from a planar metal sheet. This blank, designated by the reference numeral 110, is shown in FIG. 6A and includes a base 112, a first beam 114 extending away from the base 112 and a second beam 116 extending from the distal end 118 of the first beam 114 toward the base 112. An L-shaped support 120 extends away from the base 112, from the distal end 122 of which extends a serpentine third beam 124 toward the base 112. A plurality of contact legs 126 project from the base 112 on the opposite side thereof from the beams and the L-shaped support. In its final form, only one of the contact legs 126 will remain, but a common multi-legged blank is formed so that staggering of the contact legs may be accommodated in the final assembly of the connector assembly (FIG. 1).

The next step in the process is shown in FIG. 6B where the first beam 114 is bent counterclockwise about the region 128 beyond the elastic limit at that region. This stressing of the first beam 114 is in the direction opposite to that in which it will be stressed by the package 26 when the contact 110 is installed in the cavity 20 (FIG. 1). Also, the third beam 124 has a force exerted on it as shown by the arrow 129. This force 129 deforms the beam 124 beyond its elastic limit. As is the case with the stress to the beam 114, the stress to the beam 124 by the force 129 is in the direction opposite to that in which it will be stressed by the package 26.

The next step, as shown in FIG. 6C, is to bend the first beam 114 clockwise as far as it will go, this being where the distal end 118 of the first beam 114 abuts against the integral overstress stop 132 at the distal end 122 of the L-shaped support 120. However, before that limit is reached, the free end 108 of the second beam 116 enters the pocket 104 at the end of the third beam 124, thereby causing a counterclockwise bending of the third beam 124. This results in further deformation of the beams 114 and 124 beyond the changed elastic limits set by the previous bending step shown in FIG. 6B. Accordingly, the deformed regions of the beams 114 and 124 become work hardened.

Figure 6D:
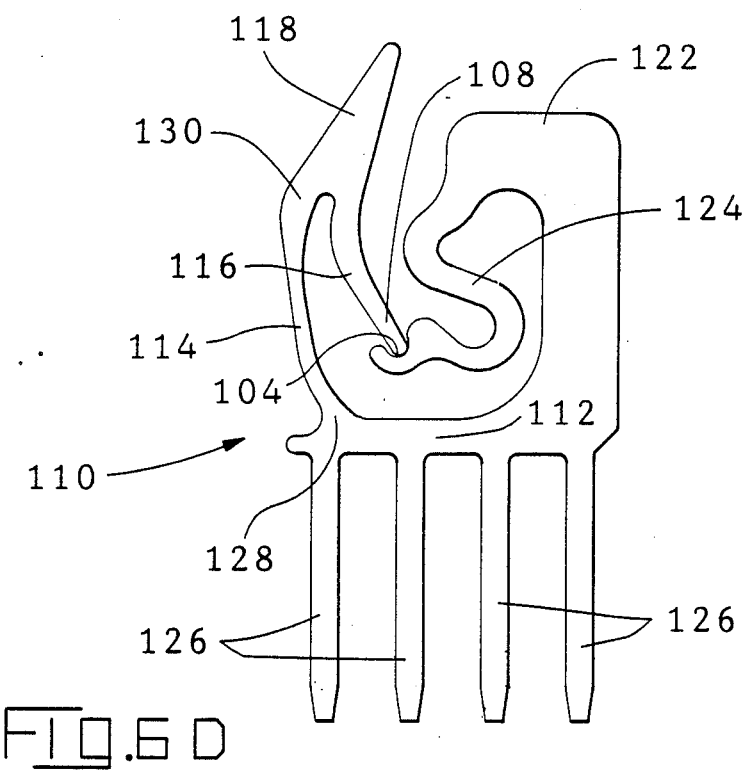

The final step in the process is to release the beams 114 and 116 so that they, as well as the beam 124, move to the equilibrium position shown in FIG. 6D. In this position, the resiliency of the serpentine beam 124 keeps the free end 108 of the beam 116 in the pocket 104. Added resiliency is provided by the juncture between the beams 114 and 116 in the region 118.

A critical element in the formation of the electrical contact according to this invention is in the work hardening of the beams 114 and 124. Although deformation of the beams beyond their elastic limits to effect the work hardening has been illustrated, other ways of work hardening can be used, such as by shot peening. It has been found that an increase of approximately 10% in the deflection of the contact portion 130 can be tolerated due to the work hardening. It has also been found that the separation of the second and third beams to provide a free pivot point (FIG. 5 versus FIG. 4) increases the allowable contact deflection.

Although the present invention has been described in terms of a connector requiring an insertion force sufficient to deflect all of the contact elements, it will be appreciated by those skilled in the art that the invention may be easily utilized in a zero insertion force connector. Such a connector may utilize an actuating element, not shown, to urge the end 118 toward the overstress stop 132 prior to inserting the package 26 in a manner that is well-known in the art. Additionally, the end 118 may be shaped in any suitable way to accommodate such an actuator.

Accordingly, an improved electrical contact and a method of forming same have been described. While several illustrative embodiments have been disclosed, it will be apparent to one of ordinary skill in the art that various modifications and adaptations to the disclosed embodiments can be made without departing from the spirit and scope of this invention, which is only intended to be limited by the appended claims.

I claim:

1. An electrical contact (110) for providing an electrical path between a first contact portion (130) and a second contact portion (126) and providing a contact force at said first contact portion (130), characterized by:

a base (112) having said second contact portion (126) projecting therefrom;

a first beam (114) having first and second ends and said first contact portion (130), said first beam first end being attached to said base;

a second beam (116) having first and second ends, said second beam first end being attached to said first beam second end, said second beam second end extending toward said base (112);

a third beam (124) having first and second ends, said third beam first end arranged for pivoting movement with respect to said second beam second end, said third beam second end attached to said base; and spring means (124, 114, 116, 118) for resiliently coupling said first contact portion (130) to said base (112);

said first and second beams being configured to convert contact induced movement of said first contact portion in a first direction to movement of said second beam second end in a second direction transverse to said first direction, said spring means applying a resisting force to said second beam second end in a third direction opposite said second direction, the extent of said movement of said second beam second end being substantially less than the extent of said contact induced movement so that said spring means remains within its elastic limit.

2. A contact according to claim 1 further characterized in that said base, said first, second and third beams, and said spring means are substantially coplanar.

3. A contact according to claim 2 further characterized in that said contact is formed as a monolithic element from a planar metal sheet.

4. A contact according to claim 3 further including integral overstress stop means (132) for limiting the deflection of said beams in the direction opposite to the generated contact force.

5. A contact according to claim 3 further characterized in that said first beam is cantilevered from said base at its first end and the compliance of the metal forming the contact allows pivoting movement of said first beam relative said base.

6. A contact according to claim 5 further characterized in that said third beam has a serpentine shape forming a pocket (104) at said third beam first end, said spring means includes said third beam, and said second beam second end (108) lies within said pocket for accommodating the pivoting movement between said second and third beams.

7. A contact according to claim 5 further characterized in that said first and second beams are continuous and said spring means includes the compliance of the metal in the region (118) where said first beam second end is joined to said second beam first end.

8. A contact according to claim 5 further characterized in that the metal at the juncture (128) of said base and said first beam is work hardened.

9. A contact according to claim 5 further characterized in that said base and said first, second and third beams are continuous and form a closed loop, with the pivoting movement between said second and third beams being accommodated by the compliance of the metal forming the contact.

10. A contact according to claim 9 further characterized in that said third beam has a serpentine shape and said spring means includes said third beam.

11. An electrical contact (110) formed as a monolithic element from a planar metal sheet for providing an electrical path between a first contact portion (130) and a second contact portion (126) and providing a contact force at said first contact portion (130), characterized by:

a base (112) having said second contact portion (126) projecting therefrom;

a first beam (114) having first and second ends and said first contact portion (130), said first beam first end being attached to said base and cantilevered therefrom, the compliance of the metal forming the contact allowing pivoting movement of said first beam relative said base;

a second beam (116) having first and second ends, said second beam first end being attached to said first beam second end, said second beam second end extending toward said base (112);

a third beam (124) having first and second ends, said third beam first end arranged for pivoting movement with respect to said second beam second end, said third beam second end attached to said base; and spring means (124, 114, 116, 118) for resiliently coupling said first contact portion (130) to said base (112);

said base, said first, second and third beams, and said spring means being substantially coplanar;

said third beam having a serpentine shape forming a pocket (104) at said third beam first end, said spring means including said third beam, and said second beam second end (108) lying within said pocket for accommodating the pivoting movement between said second and third beams.

* * * * *